United States Patent [19]

Aoki

[11] 4,418,418
[45] Nov. 29, 1983

[54] PARALLEL-SERIAL CONVERTER

[75] Inventor: Kazuhide Aoki, Kawasaki, Japan

[73] Assignee: Tokyo Shibaura Denki Kabushiki Kaisha, Japan

[21] Appl. No.: 324,557

[22] Filed: Nov. 24, 1981

[30] Foreign Application Priority Data

Jan. 13, 1981 [JP] Japan .................................. 56-2747

[51] Int. Cl.³ ...................... G11C 19/28; H03K 23/22
[52] U.S. Cl. ...................................... 377/79; 307/269; 377/74; 377/105; 377/106
[58] Field of Search ....................... 377/54, 67, 73, 74, 377/76, 79, 80, 105, 106, 117; 307/481, 269

[56] References Cited

U.S. PATENT DOCUMENTS

| | | | |
|---|---|---|---|
| 3,431,433 | 3/1969 | Ball et al. | 377/79 X |
| 3,573,498 | 4/1971 | Ahrons | 377/79 |
| 3,619,642 | 11/1971 | Dunn | 377/54 X |
| 3,646,526 | 2/1972 | Fagan et al. | 377/79 X |
| 3,708,690 | 1/1973 | Paivinen | 377/54 |
| 4,045,685 | 8/1977 | Gehrig | 377/117 X |
| 4,231,052 | 10/1980 | Day et al. | 377/67 X |

OTHER PUBLICATIONS

Leventhal, *Introduction to Microprocessors: Software, Hardware, Programming*, Prentice-Hall, Inc., New Jersey, 1978, pp. 303-305.

The Bipolar Digital Integrated Circuits Data Book for Design Engineers; Texas Instruments Incorporated; 1976.

RCA Solid-State DATABOOK Series COS/MOS Digital Integrated Circuits; RCA Corporation; 1972.

Primary Examiner—Larry N. Anagnos
Assistant Examiner—David R. Hudspeth
Attorney, Agent, or Firm—Finnegan, Henderson, Farabow, Garrett & Dunner

[57] ABSTRACT

A parallel-serial converter comprises a plurality of selection-delay unit circuits. The unit circuit selectively receives an output signal from the immediately preceding unit circuit and one of a plurality of input parallel signals and shifts the selectively received signal to the immediately succeeding unit circuit. The selection-delay unit circuit is only formed of three transfer gates and two inverters in order to reduce a chip size and save power consumption.

2 Claims, 14 Drawing Figures

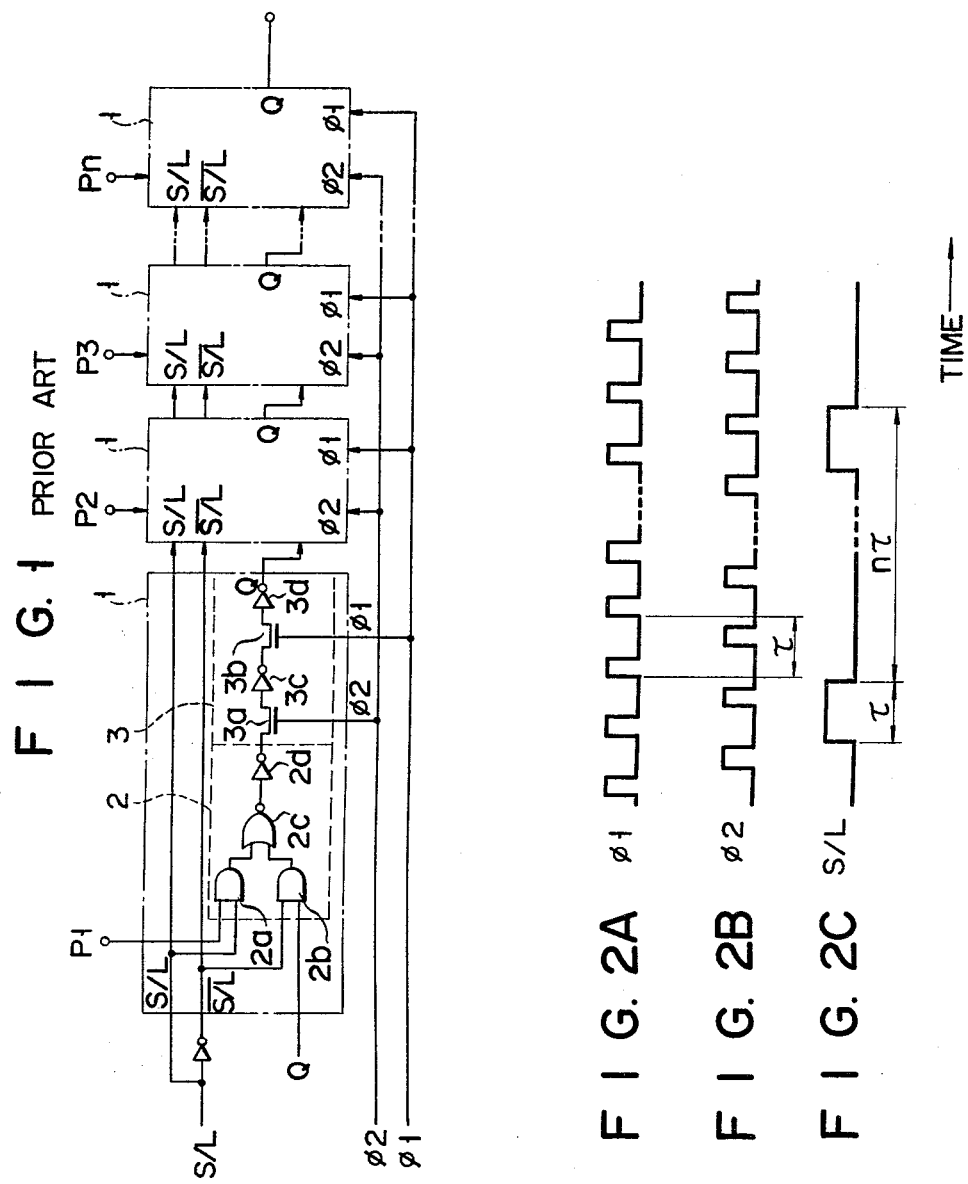

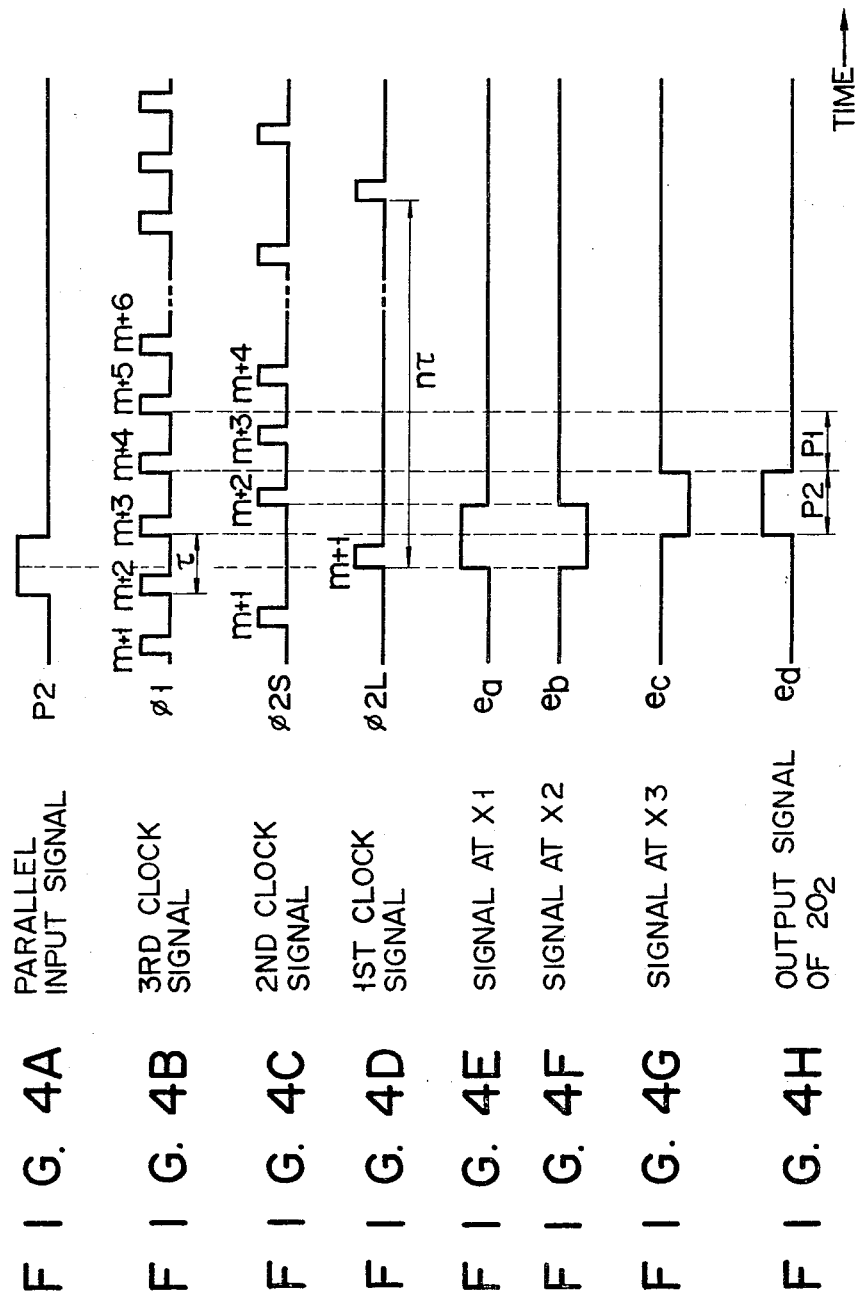

PARALLEL-SERIAL CONVERTER

BACKGROUND OF THE INVENTION

This invention relates to a parallel-serial converter and more particularly to a parallel-serial converter which is formed of MOS transistors and adapted to be included in a large scale integrated (LSI) circuit.

The conventional parallel-serial converter is constructed, as shown in FIG. 1, by cascade connecting a plurality of selection-delay unit circuits 1, each of which receives the corresponding one of parallel signals P1 to Pn, and also an output signal from the immediately preceding unit circuit, and sends forth an output signal to the immediately succeeding unit circuit, and is further so arranged that the final unit circuit issues parallel signals Pn to P1. The conventional selection-delay unit circuit, for example, the unit circuit 1 supplied with a parallel signal P1 is arranged as shown in FIG. 1. The unit circuit 1 comprises a selection circuit 2 and delay circuit or shift register 3. The selection circuit 2 comprises AND gates 2a, 2b, NOR gate 2c and inverter 2d. The shift register 3 comprises transfer gates 3a, 3b, and shift register 3 comprises transfer gates 3a, 3b, and inverters 3c, 3d. The AND gate 2a is supplied with a parallel signal P1 and mode selection signal S/L. The AND gate 2b is supplied with a mode selection signal $\overline{S/L}$ and an output signal Q from the immediately preceding unit circuit. The selection circuit 2 selects either the output signal Q or the parallel signal P1 and delivers the selected signal to the shift register 3. This shift register 3 is actuated in response to input clock signals $\phi 1$ and $\phi 2$ and delivers an output signal Q delayed by the period of the clock signal $\phi 1$ or $\phi 2$ to the immediately succeeding unit circuit. To describe in greater detail with reference to FIGS. 2A to 2C, a clock signal $\phi 1$ shown in FIG. 2A is supplied to the control gate of the transfer gate 3b. The clock signal $\phi 2$ having an opposite phase to that of the clock signal $\phi 1$ of FIG. 2A is conducted to the control gate of the transfer gate 3a. The period of the clock signals $\phi 1$, $\phi 2$ has a period of one $\tau$. As shown in FIG. 2C, the mode selection signal S/L has a pulse width of one $\tau$ and a period of n$\tau$. (The numeral n denotes a number of parallel signals.) Where the mode selection signal S/L has a logic level "1" (referred to as "a load mode"), then a parallel signal P1 is supplied to the selection circuit 2. Where the mode selection signal S/L has a logic level "0" where referred to as "a shift mode", then the parallel signal P1 supplied to the selection circuit 2 is shifted in the shift register 3 by one $\tau$. A signal thus shifted is conducted to the selection circuit 2 of the immediately succeeding unit circuit 1. As a result, the final unit circuit 1 sends forth serial signals converted from the parallel signals P1 to Pn in the order of Pn to P1.

As seen from FIG. 1, the conventional selection circuit 2 comprises two AND gates 2a, 2b and NOR gate 2c and inverter 2d. When arranged into the LSI form, therefore, the parallel-serial converter has the drawbacks of unavoidably enlarging a chip size and increasing power consumption. Where the parallel signals have a large bit number n, the above-mentioned drawbacks prominently appear.

SUMMARY OF THE INVENTION

It is accordingly the object of this invention to provide a parallel-serial converter adapted for the LSI type which comprises a smaller number of semiconductor elements constituting a selection-delay unit circuit than has been required in the past, thereby reducing a chip size and saving power consumption.

To attain the above-mentioned object, this invention provides a parallel-serial converter which comprises a plurality of cascade-connected selection-delay unit circuits, each of which delays a signal selected from a plurality of input signals, and which converts parallel input signals into serial signals. Each selection-delay unit circuit comprises a first transfer gate which receives a parallel signal and whose control gate is supplied with a first clock signal; a second transfer gate which receives an output signal from the immediately preceding selection-delay unit circuit and whose control gate is supplied with a second clock signal; a first inverter which receives output signals from the first and second transfer gates; a third transfer gate which receives an output signal from the first inverter and whose control gate is supplied with a third clock pulse; and a second inverter which receives an output signal from the third transfer gate and sends forth an output signal to the second transfer gate of the immediately succeeding selection-delay unit circuit. The first clock signal has a phase opposite to that of the third clock signal and is supplied to the control gate of the first transfer gate only during the load mode in which a parallel signal is supplied to the selection-delay unit circuit. The second clock signal has a phase opposite to that of the third clock signal and is supplied to the control gate of the second transfer gate only during the shift mode in which the previously supplied parallel signal is shifted.

BRIEF DESCRIPTION OF THE DRAWINGS

FIG. 1 is a block circuit diagram of the conventional parallel-serial converter;

FIGS. 2A to 2C illustrate the waveforms of clock signals for driving the parallel-serial converter of FIG. 1;

FIGS. 4A to 4H illustrate the waveforms of various signals for driving the parallel-serial converter and of various parts of FIG. 3.

DETAILED DESCRIPTION OF THE PREFERRED EMBODIMENT

Figure 3:
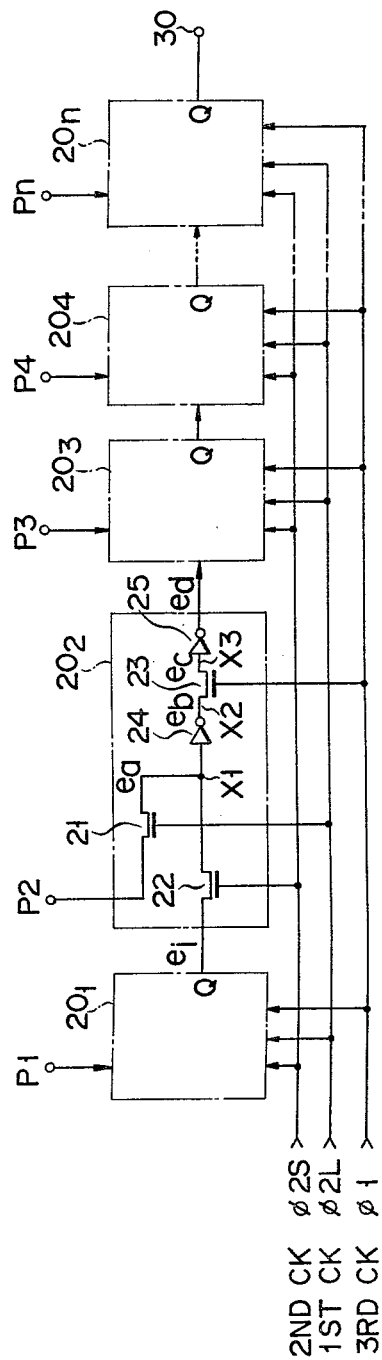
FIG. 3 is a block circuit diagram of a parallel-serial converter embodying this invention.

Referring to FIG. 3, reference numerals $20_1$ to $20_n$ denote cascade connected selection-delay unit circuits. Parallel signals P1 to Pn are respectively supplied to the corresponding selection-delay unit circuits. First, second and third clock signals $\phi 2L$, $\phi 2S$, $\phi 1$ are supplied in common to the selection-delay unit circuits. An output signal Q ($e_d$), of, for example, a unit circuit $20_2$ is supplied to the immediately succeeding unit circuit $20_3$. Thus, the final unit circuit $20_n$ issues serial signals in the order of Pn to P1. Since all the selection-delay unit circuits have the same arrangement, description is now given of the arrangement of the selection-delay unit circuit $20_2$ supplied with a parallel signal P2 as a representative. This unit circuit $20_2$ comprises a first transfer gate 21 receiving a parallel signal P2, a second transfer gate 22 receiving an output signal $e_i$ from the immediately preceding unit circuit $20_1$, a first inverter 24 receiving output signals from the first and second transfer gates 21, 22, a third transfer gate 23 receiving an output signal from the first inverter, and a second inverter 25 receiving an output signal from the third transfer gate and sending forth an output signal Q (e$_d$) to the second transfer gate of the immediately succeeding unit circuit 20$_3$. A first clock signal ⌀2L is conducted to the control gate of the first transfer gate 21. A second clock signal ⌀2S is supplied to the control gate of the second transfer gate 22. A third clock signal ⌀1 is delivered to the control gate of the third transfer gate 23.

Description is now given with reference to the waveforms of FIGS. 4A to 4H of the operation of a parallel-serial converter embodying this invention. In this case, it is assumed that a parallel signal P1 has a logic level "0," and a parallel signal P2 has a logic level "1." Where the first transfer gate 21 is rendered conducting at the rise of a first clock signal ⌀2L of the m+1 order, then the parallel signal P2 passes through the first transfer gate 21 and is retained at point X1 until the second clock signal ⌀2S rises (that is, held by a gate capacitance and stray capacitance at point X1). A signal at point X1 is denote by e$_a$ (FIG. 4E). The width of this signal e$_a$ (having a logic level "1") has a width corresponding to one period τ of the third clock signal ⌀1 and equal to one bit period. The signal e$_a$ is inverted by the first inverter 24. A signal at point X2 is changed into e$_b$. Where the third clock signal ⌀1 of the m+3 order rises, then the signal e$_b$ (having a logic level "0") is supplied to the third transfer gate 23, which in turn issues a signal e$_c$. This signal e$_c$ is held at point X3 during a period extending from the rise of the third clock signal ⌀1 of the m+3 order to the rise of the third clock signal ⌀1 of the m+4 order (FIG. 4G). The signal e$_c$ is inverted by the second inverter 25. The inverted output signal e$_d$ having a logic level "1" (FIG. 4H) is supplied to the second transfer gate 22 of the immediately succeeding unit circuit 20$_3$. Where the second transfer gate 22 is rendered conducting at the rise of a second clock signal ⌀2S of the m+2 order, then an output signal e$_i$ from the immediately preceding unit circuit 20$_1$ is conducted to the second transfer gate 22. Therefore, at the rise of the aforementioned second clock signal ⌀2S, a signal at point X1 is changed into e$_i$. As previously described, a parallel signal P1 supplied to the unit circuit 20$_1$ has a logic level "0". Therefore, at a time slot at which the third inverter 25 of the unit circuit 20$_2$ sends forth a signal e$_d$ (having a logic level "1") corresponding to an input parallel signal P2, an output signal e$_i$ from the unit circuit 20$_1$ has a logic level "0". As a result, the signal e$_a$ (having a logic level "1") falls to a logic level "0" (FIG. 4E) at the rise of the second clock signal ⌀2S of the m+2 order. The signal e$_b$ rises to have a logic level "1" (FIG. 4F). The third transfer gate 23 is rendered conducting at the rise of the third clock signal ⌀1 of the m+4 order. At the rise of the third clock signal ⌀1 of the m+4 order, therefore, the signal e$_c$ rises to have a logic level "1," and the signal e$_d$ falls to have a logic level "0."

The above-mentioned operation of the parallel-serial converter of this invention may be summarized as follows. During the period of one τ of the third clock signal ⌀1 after receipt of the first clock signal ⌀2L of the m+1 order, namely, during a period extending from the rise of the third clock signal ⌀1 of the m+3 order to the rise of the third clock signal ⌀1 of the m+4 order, the second inverter 25 of the unit circuit 20$_2$ issues the signal e$_d$ (having a logic level "1"). During the immediately succeeding one τ period of the third clock signal ⌀1, namely, during a period extending from the rise of the third clock signal ⌀1 of the m+4 order to the rise of the third clock signal ⌀1 of the m+5 order, the second inverter 25 sends forth a signal e$_d$ (having a logic level "0"). The above-mentioned signal e$_d$ (having a logic level "1") corresponds to the parallel signal P2 (having a logic level "1"). The signal e$_d$ (having a logic level "0") corresponds to the parallel signal P1. If, therefore, both parallel signals P1, P2 have a logic level "1", then the signal e$_d$ (FIG. 4H) does not fall at the rise of the third clock signal ⌀1 of the m+4 order. Namely, the signal e$_d$ retains a logic level "1" during a period extending from the rise of the third clock signal ⌀1 of the m+4 order to the rise of the third clock signal ⌀1 of the m+5 order.

Description was given of the operation of the selection-delay unit circuit 20$_2$ taken as a representative. The other unit circuits are operated in the same manner as the unit circit 20$_2$. Therefore, the output terminal 30 sends forth serial signals in the order of Pn to P1.

Figure 5:
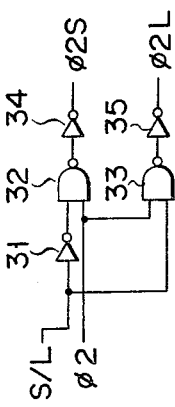
FIG. 5 is a logic circuit for generating the drive signals of FIGS. 4C and 4D.

The clock signals ⌀2S, ⌀2L respectively having the waveforms of FIGS. 4C and 4D can be easily formed from the waveforms of the clock signals ⌀2 and S/L. As shown in FIG. 5, a mode selection signal S/L of FIG. 2C is supplied to one of the input terminals of a first NAND gate 32 through an inverter 31. The clock signal ⌀2 (FIG. 2B) having a phase opposite to that of the clock signal ⌀1 is supplied to the first NAND gate 32. Where an output signal from the first NAND gate 32 is inverted by an inverter 34, then the second clock signal ⌀2S (FIG. 4C) is obtained. Where an output signal from the NAND gate 33 supplied with the mode selection signal S/L (FIG. 2C) and clock signal ⌀S (FIG. 2B) is inverted by an inverter 35, then the first clock signal ⌀2L is obtained.

As seen from FIGS. 1 and 3, it is possible to omit two AND gates, one NOR gate and one inverter simply by adding one transfer gate to the shift register of the conventional selection-delay unit circuit of FIG. 1. This fact obviously means that where a parallel-serial converter embodying this invention is integrated, it is possible to reduce a chip size and save power consumption. Though the present parallel-serial converter has to be constructed by adding the logic circuit of FIG. 5 to the device of FIG. 3, this addition obviously has very little effect on the decrease of a chip size and the reduction of power consumption.

What is claimed is:

1. A parallel-serial converter which comprises a plurality of cascade connected selection-delay unit circuits, each of which delays a signal selected from a plurality of input signals, and which converts parallel input signals into serial signals, said selection-delay unit circuit comprising:
 a first transfer gate which receives a parallel signal and whose control gate is supplied with a first clock signal;
 a second transfer gate which receives an output signal from the immediately preceding selection-delay unit circuit, and whose control gate is supplied with a second clock signal;
 a first inverter which receives output signals from said first and second transfer gates;
 a third transfer gate which receives an output signal from said first inverter and whose control gate is supplied with a third clock signal; and
 a second inverter which receives an output signal from said third transfer gate and sends forth an output signal to the second transfer gate of the immediately succeeding selection-delay unit circuit;

said first clock signal having a phase opposite to that of said third clock signal, and being supplied to the control gate of said first transfer gate only during the load mode in which a parallel signal is supplied to the selection-delay unit circuit; and said second clock signal having a phase opposite to that of said third clock signal, and being supplied to the control gate of said second transfer gate only during the shift mode in which the previously supplied parallel signal is shifted.

2. The parallel-serial converter according to claim 1, which comprises a logic circuit for generating first and second clock signals, and wherein the logic circuit comprises:

a first NAND gate, one of whose input terminals receives a fourth clock signal and the other of whose input terminals receives a fifth clock signal through a third inverter;

a fourth inverter which receives an output signal from said first NAND gate and sends forth said second clock signal;

a second NAND gate which receives said fourth and fifth clock signals; and a fifth inverter which receives an output signal from said second NAND gate and issues said first clock signal;

and wherein said fourth clock signal has a phase opposite to that of said third clock signal; and said fifth clock signal has a width equal to one period of said third clock signal and a period n times the period of said third clock signal where n is a number of the selection-delay unit circuits.

* * * * *